(12) United States Patent
Choi et al.

(10) Patent No.: US 8,017,465 B2
(45) Date of Patent: Sep. 13, 2011

(54) METHOD FOR MANUFACTURING ARRAY SUBSTRATE OF LIQUID CRYSTAL DISPLAY

(75) Inventors: Seungjin Choi, Beijing (CN); Youngsuk Song, Beijing (CN); Seongyeol Yoo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/565,953

(22) Filed: Sep. 24, 2009

(65) Prior Publication Data

US 2010/0075450 A1 Mar. 25, 2010

(30) Foreign Application Priority Data

Sep. 25, 2008 (CN) .......................... 2008 1 0222792

(51) Int. Cl.
*H01L 21/336* (2006.01)
*H01L 21/8234* (2006.01)

(52) U.S. Cl. .......... 438/197; 438/30; 438/706; 438/745; 257/E21.051; 257/E21.229; 257/E21.252; 257/E21.259; 257/E21.492

(58) Field of Classification Search .................. 438/30, 438/149, 197, 706, 745; 257/E21.051, 229, 257/245, 252, 259, 492
See application file for complete search history.

(56) References Cited

U.S. PATENT DOCUMENTS

| 6,338,989 B1* | 1/2002 | Ahn et al. ..................... 438/158 |
| 6,818,923 B2* | 11/2004 | Kim et al. ....................... 257/72 |
| 7,518,698 B2* | 4/2009 | Kim et al. ..................... 349/158 |
| 2003/0197182 A1* | 10/2003 | Kim et al. ....................... 257/72 |
| 2007/0164330 A1* | 7/2007 | Jeong et al. ................... 257/291 |
| 2008/0248617 A1* | 10/2008 | Jeong et al. ................... 438/160 |

FOREIGN PATENT DOCUMENTS

| KR | 10-0619624 B1 | 8/2006 |
| KR | 2008-45076 A | 5/2008 |
| KR | 2008-64712 A | 7/2008 |

* cited by examiner

*Primary Examiner* — David Nhu
(74) *Attorney, Agent, or Firm* — Ladas & Parry LLP

(57) ABSTRACT

A method for manufacturing an array substrate of liquid crystal display is performed with the following steps: providing a substrate having gate lines, a gate insulating layer and an active layer pattern formed thereon in this order; depositing a first transparent conductive layer and a source/drain metal layer in this order on the substrate; forming a photoresist layer on the source/drain metal layer through a triple-tone mask; performing a wet-etching process on the source/drain metal layer and the first transparent conductive layer exposed from the photoresist layer; performing a first ashing process on the photoresist layer and performing a dry-etching process on the source/drain metal layer, the first transparent conductive layer and the active layer pattern exposed by the first ashing process; performing a second ashing process on the photoresist layer and performing a wet-etching process on the source/drain metal layer exposed by the second ashing process; and removing the remaining photoresist layer. According to the invention, the over-etching on the TFT channel region can be reduced and the display quality of the liquid crystal display can be ensured.

10 Claims, 7 Drawing Sheets

METHOD FOR MANUFACTURING ARRAY SUBSTRATE OF LIQUID CRYSTAL DISPLAY

BACKGROUND

Embodiments of the present invention relate to a method for manufacturing an array substrate of liquid crystal display, and more particularly to a method for manufacturing an array substrate of liquid crystal display capable of reducing the over-etching.

Nowadays, an array substrate of liquid crystal display panel is typically manufactured by photolithographic process and since the mask employed by the photolithographic process is expensive, reducing the number of the masks to be used is a key for reducing the cost and enhancing the competitive ability.

Several methods have been proposed for reducing the number of the masks employed in the photolithographic process. For example, there is proposed a method in which the transparent electrode (formed by ITO, IZO and the like), the source electrode, the drain electrode and the thin film transistor (TFT) channel are formed through a dual tone mask. The method can be applied to manufacture array substrates for the twist nematic (TN) type liquid crystal display, the fringe field switching type liquid crystal display and the like.

The conventional method for manufacturing an array substrate of TN type liquid crystal display by four photolithographic processes specifically comprises the following steps:

Step 1 of depositing a gate metal layer on a substrate, forming a gate line through a first mask by a first photolithographic process, and forming a gate electrode which could be extended from and integrated with the gate line depending on the requirements;

Step 2 of depositing a gate insulating layer, an active layer (a semiconductor layer and a doped semiconductor layer) on the substrate after step 1 and forming an active layer pattern through a second mask by a second photolithographic process;

Step 3 of depositing a transparent conductive layer and a source/drain metal layer in this order on the substrate after step 2 and forming a pixel electrode, a source electrode, a drain electrode and a TFT channel through a third mask (a dual-tone mask) by a third photolithographic process;

Step 4 of depositing a passivation layer on the substrate after step 3 and forming a passivation layer pattern and via holes through a fourth mask by a fourth photolithographic process.

In addition, the conventional method for manufacturing an array substrate of FFS type liquid crystal display by four photolithographic processes specifically comprises the following steps:

Step 1 of depositing a gate metal layer on a substrate, forming a gate line through a first mask by a first photolithographic process, and forming a gate electrode which could be extended from and integrated with the gate line depending on the requirements;

Step 2 of depositing a gate insulating layer, an active layer (a semiconductor layer and a doped semiconductor layer) on the substrate after step 1 and forming an active layer pattern through a second mask by a second photolithographic process;

Step 3 of depositing a first transparent conductive layer and a source/drain metal layer in this order on the substrate after step 2 and forming a pixel electrode, a source electrode, a drain electrode and a TFT channel through a third mask (a dual-tone mask) by a third photolithographic process;

Step 4 of depositing a passivation layer and a second transparent conductive layer on the substrate after step 3 and forming a passivation layer pattern, via holes and a common electrode through a fourth mask by a fourth photolithographic process.

In the above-described methods for manufacturing the array substrate of liquid crystal display, the pixel electrode, the source electrode, the drain electrode and the TFT channel are formed through one dual-tone mask by one photolithographic process so that the production cost is reduced. However, it is found that the display quality of liquid crystal display may suffer by using the above methods, which will be described in detail as follows.

Referring to FIG. 1 and FIG. 2A to FIG. 2G, in which FIG. 1 is a structural schematic view showing a conventional array substrate of liquid crystal display; FIG. 2A is cross section view showing a conventional substrate formed with a gate electrode, a gate insulating layer and an active layer pattern after depositing a first transparent conductive and a source/drain metal layer; FIG. 2B is a cross section view showing the substrate after exposing and developing the photoresist on the substrate of FIG. 1 through a dual-tone mask to form a photoresist pattern layer; FIG. 2C is a cross section view showing the substrate after etching the substrate of FIG. 2B; FIG. 2D is a cross section view showing the substrate after ashing the photoresist pattern layer on the substrate of FIG. 2C; FIG. 2E is a cross section view showing the substrate after etching the substrate of FIG. 2D; FIG. 2F is a cross section view showing the substrate after removing the photoresist pattern layer of FIG. 2E.

As shown in FIG. 1, the array substrate of liquid crystal display comprises a pixel region 101, a non-display region and a TFT region 102. The non-display region comprises a wiring region and other regions located between the pixel regions 101. The TFT region 102 comprises a TFT channel region 1021, a source electrode region 1022 and a drain electrode region 1023. The wiring region comprises a gate line region 103 and a data line region 104. The pixel region 101 is the region formed by a plurality of pixel electrodes 141, the gate line region 103 is the region formed by a plurality of gate lines 11, and the data line region 104 is the region formed by a plurality of data lines 16.

Hereinafter, the conventional for manufacturing an array substrate of liquid crystal display will be described with reference to FIG. 2A-2F. Specifically, the method comprises the steps as follows.

Step 1 of depositing a first transparent conductive layer 14 and a metal layer 15 for source/drain electrodes in this order on a substrate 10 formed with a gate line 11 with integrated gate electrode 111, an insulating layer 12 and an active layer pattern 13, as shown in FIG. 2A;

Step 2 of depositing a photoresist layer and forming a photoresist pattern layer 100 through a dual-tone mask by exposing and developing process, wherein the thickness of the photoresist pattern layer 100 in the pixel region 101 is smaller than the thickness of the photoresist pattern layer 100 in the source electrode region 1022, the drain electrode region 1023 and the data line region 104, as shown in FIG. 2B;

Step 3 of performing a wet-etching process on a large area of the substrate 10 so that the metal layer 15 for source/drain electrodes, the first transparent conductive layer 14 and a portion of the active layer in the exposed region of the substrate 10 are etched to form a source electrode 151 and a TFT channel 131 respectively, as shown in FIG. 2C;

Step 4 of performing an ashing process on the photoresist pattern layer 100 to expose the metal layer 15 in the pixel region 101, as shown in FIG. 2D;

Step 5 of performing a wet-etching process on a large area of the substrate 10 so that the metal layer 15 for source/drain electrodes in the exposed region of the substrate 10 is etched to form a pixel electrode 141 and a drain electrode 152, as shown in FIG. 2E; and Step 6 of removing the remaining photoresist pattern layer, as shown in FIG. 2F.

In the above-described step 3 and step 5, two etching processes on a large area of the substrate are required for forming the TFT channel, the source electrode, the drain electrode and the pixel electrode. Furthermore, in the case of performing etching on a large area, only the wet-etching process is feasible, that is, the substrate is immersed into the etching solution and the portion which is not covered by the photoresist is etched by the etching solution. Since the TFT channel region is wet-etched twice in the above method and it is difficult to control the degree of etching in the wet-etching process, the problem of over-etching the TFT channel occurs.

SUMMARY OF THE INVENTION

The object of the invention is to provide a method for manufacturing an array substrate of liquid crystal display, so that the over-etching on the TFT channel can be reduced and the display quality of the liquid crystal can be ensured.

In one aspect, a method for manufacturing an array substrate of liquid crystal display is provided in the invention and the method comprises the following steps:

a. providing a substrate having gate lines, a gate insulating layer and an active layer pattern formed thereon in this order;

b. depositing a first transparent conductive layer and a source/drain metal layer in this order on the substrate;

c. forming a photoresist pattern layer on the source/drain metal layer through a triple-tone mask;

d. performing a wet-etching process on the source/drain metal layer and the first transparent conductive layer exposed from the photoresist pattern layer;

e. performing a first ashing process on the photoresist pattern layer and performing a dry-etching process on the source/drain metal layer, the first transparent conductive layer and the active layer pattern exposed by the first ashing process;

f. performing a second ashing process on the photoresist pattern layer and performing a wet-etching process on the source/drain metal layer exposed by the second ashing process; and g. removing the remaining photoresist pattern layer.

In another aspect, a method for manufacturing an array substrate of liquid crystal display is further provided in the invention and the method comprises the following steps:

aa. providing a substrate with a first metal layer, a first insulating layer, a semiconductor layer and a doped semiconductor layer formed on a TFT region, wherein the substrate is covered by the first insulating layer, the substrate comprises a pixel region, a non-display region and a TFT region, and the TFT region comprises a TFT channel region, a source electrode region and a drain electrode region;

bb. depositing a first transparent conductive layer and a second metal layer in this order on the substrate after the step aa;

cc. forming a photoresist pattern layer on the second metal layer through a triple-tone mask, wherein the photoresist pattern layer in the TFT channel region has a first thickness, the photoresist pattern layer in the pixel region has a second thickness, the photoresist pattern layer in the source electrode region and the drain electrode region has a third thickness, and the first thickness is smaller than the second thickness while the second thickness is smaller than the third thickness;

dd. etching the second metal layer and the first transparent conductive layer;

ee. performing a first ashing process on the photoresist pattern layer to expose the second metal layer in the TFT channel region;

ff. etching the second metal layer, the first transparent conductive layer and the doped semiconductor layer in the TFT channel region;

gg. performing a second ashing process on the photoresist pattern layer to expose the second metal layer in the pixel region;

hh. etching the second metal layer in the pixel region; and ii. removing the remaining photoresist pattern layer.

According to the invention, the photoresist pattern layer is also formed on the TFT channel region through a triple-tone mask so that the TFT channel region is protected when the first wet-etching process is carried out, and then the TFT channel is formed by the dry-etching process capable of accurately controlling the degree of etching. In this way, the TFT channel is subject to one dry-etching process and one wet-etching process in the present invention while it is conventionally subject to two wet-etching processes. Since the number of wet-etching processes performed on the TFT channel is decreased, the over-etching can be reduced and thus the display quality degradation of the liquid crystal display due to excessive wide TFT channel can be avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Figure 3:
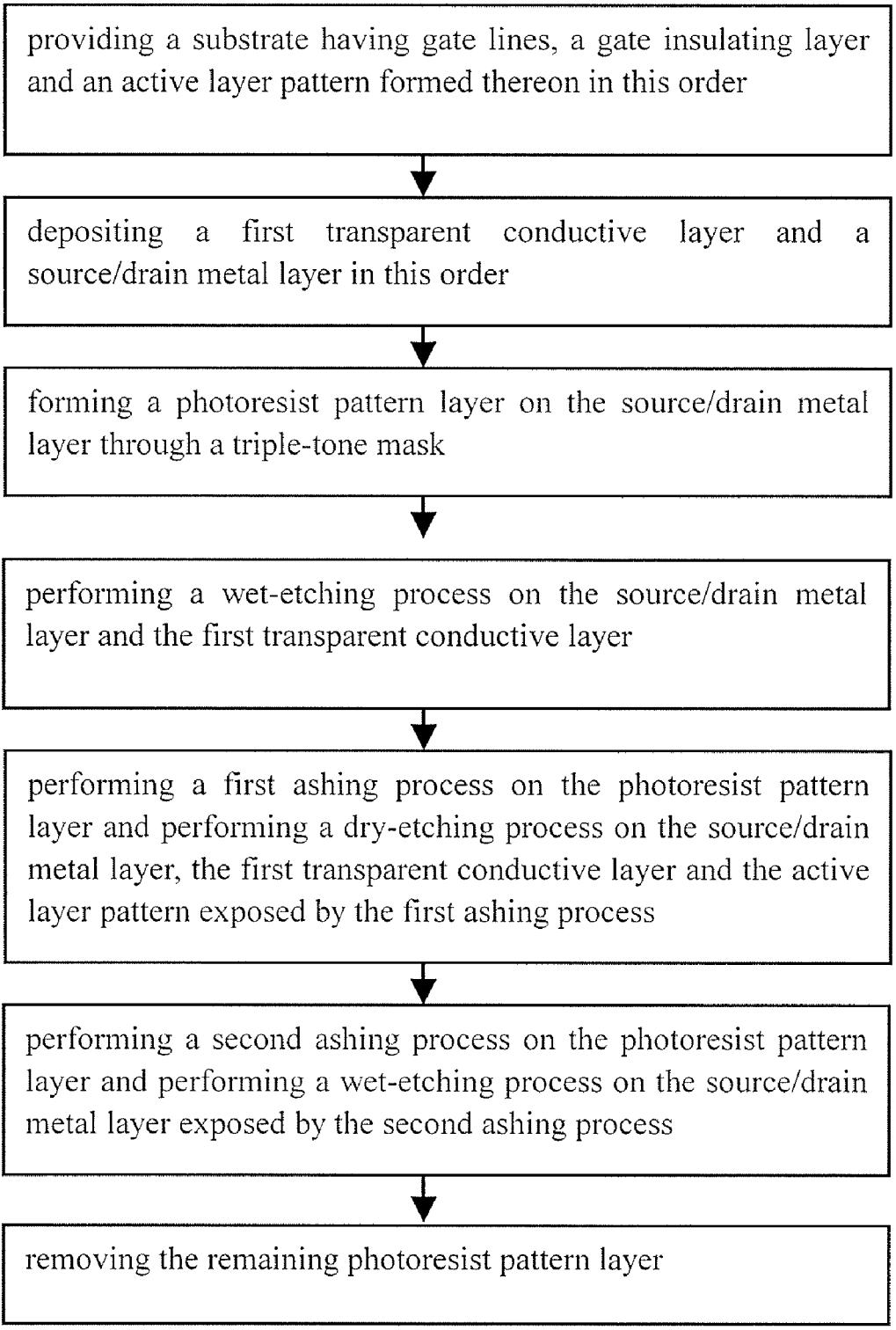
FIG. 3 is a flow chart showing a method for manufacturing an array substrate of liquid crystal display according to an embodiment of the invention.

FIG. 3 is a flow chart showing a method for manufacturing an array substrate of liquid crystal display according to an embodiment of the invention. Specifically, the method for manufacturing an array substrate of liquid crystal display in the invention can comprise the following steps:

a. providing a substrate formed with a gate line with integrated gate electrode, a gate insulating layer and an active layer pattern in this order;

b. depositing a first transparent conductive layer and a source/drain metal layer in this order on the substrate;

c. forming a photoresist pattern layer on the source/drain metal layer through a triple-tone mask;

d. performing a wet-etching process on the source/drain metal layer and the first transparent conductive layer exposed from the photoresist pattern layer;

e. performing a first ashing process on the photoresist pattern layer and performing a dry-etching process on the source/drain metal layer, the first transparent conductive layer and the active layer pattern exposed by the first ashing process so as to form a TFT channel region and a source electrode;

f. performing a second ashing process on the photoresist pattern layer and performing a wet-etching process on the source/drain metal layer exposed by the second ashing process so as to form a pixel electrode and a drain electrode; and g. removing the remaining photoresist pattern layer.

The triple-tone mask used in step c has three types of regions with different transmissivity, therefore the photoresist pattern layer formed through the triple-tone mask has three different thickness, that is, the thickness of the region to be exposed by the first ashing process of step e is thinner than the thickness of the region to be exposed by the second ashing process of step f, and the thickness of the region to be exposed by the second ashing process of step f is thinner than the thickness of the region corresponding to the remaining region of step g.

In addition, since the photoresist pattern layer is also formed on the TFT channel region through a triple-tone mask as described above, the TFT channel region can be protected by the photoresist pattern layer and the TFT channel can be formed by the dry-etching process capable of accurately controlling the extent to be etched. In this way, the TFT channel is subject to one dry-etching process and one wet-etching process in the invention while it is conventionally subject to two wet-etching processes. Since the number of wet-etching processes performed on the TFT channel is decreased, the over-etching can be reduced and thus the display quality degradation of the liquid crystal display due to excessive wide TFT channel can be avoided.

The method for manufacturing the array substrate of liquid crystal display in the invention may further comprise the following steps:

h. depositing an insulating layer on the substrate after step g and forming a passivation layer pattern and a via hole by a photolithographic process, i. depositing a second transparent conductive layer on the substrate and forming a common electrode by a photolithographic process.

In addition, with a lift-off process, the step h and the step i can be completed by using one photolithographic process as follows:

j. depositing an insulating layer on the substrate after step g without removing photoresist, depositing a second transparent conductive layer on the photoresist and the passivation layer pattern, forming a passivation layer pattern by a photolithographic process and forming a common electrode on the passivation layer pattern using a lift-off process by removing the second transparent conductive layer on the photoresist.

The embodiment of the method for manufacturing the array substrate of liquid crystal display in the present invention will be described in detail hereinafter.

Figure 1:
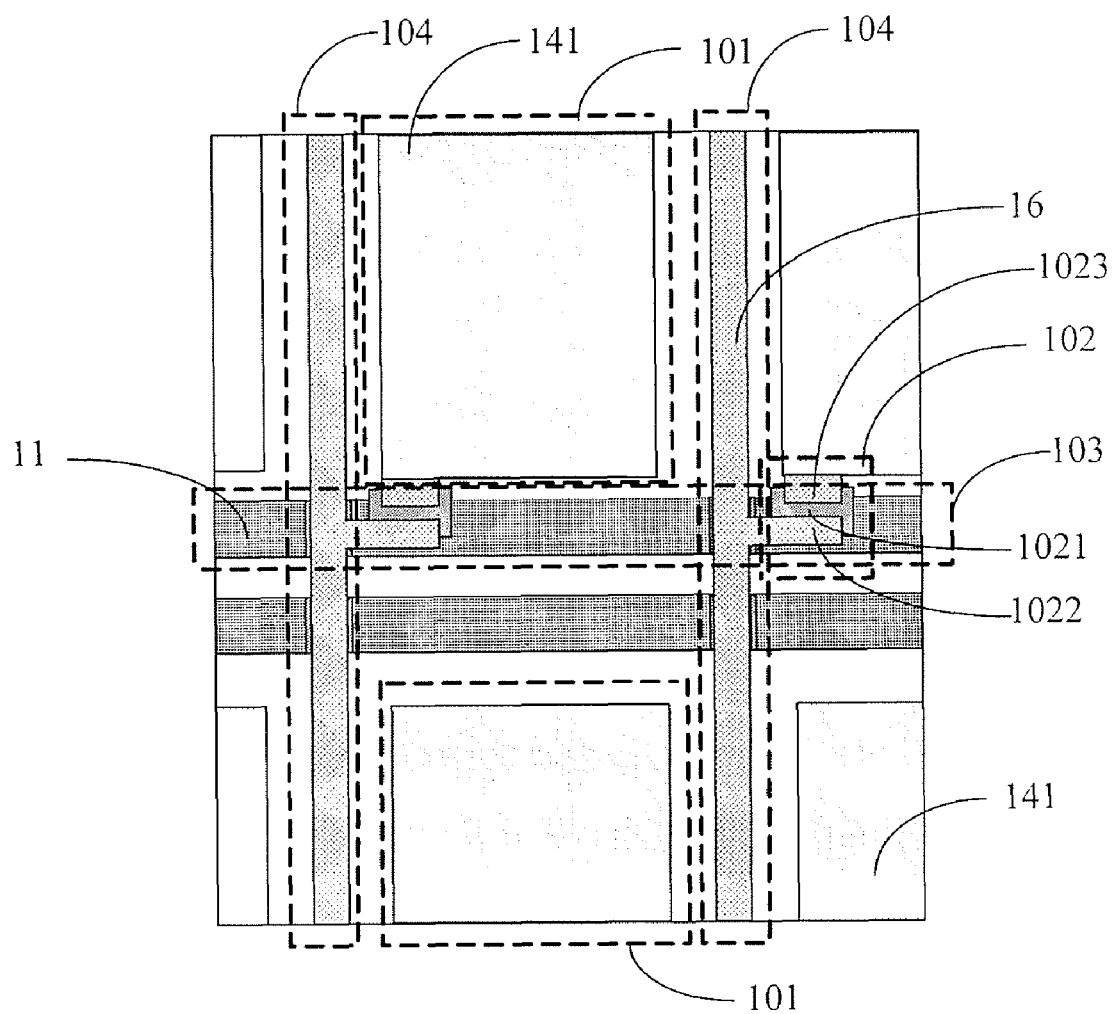
FIG. 1 is a structural schematic view showing a conventional array substrate of liquid crystal display.
Figure 2A:
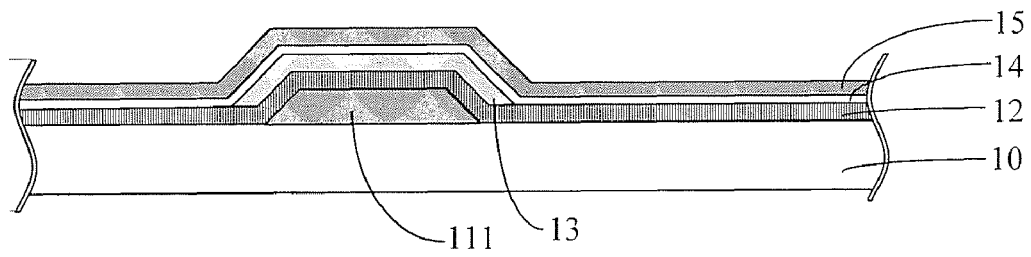
FIG. 2A is cross section view showing a conventional substrate having a gate electrode, a gate insulating layer and an active layer pattern formed thereon after depositing a first transparent conductive and a source/drain metal layer.
Figure 2B:
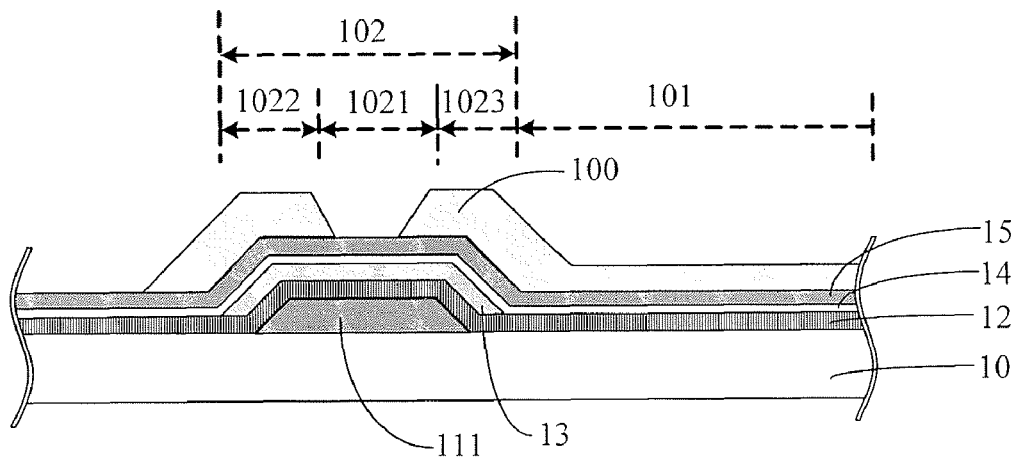
FIG. 2B a cross section view showing the substrate after exposing and developing the photoresist on the substrate of FIG. 1 through a dual-tone mask to form a photoresist pattern layer.
Figure 2C:
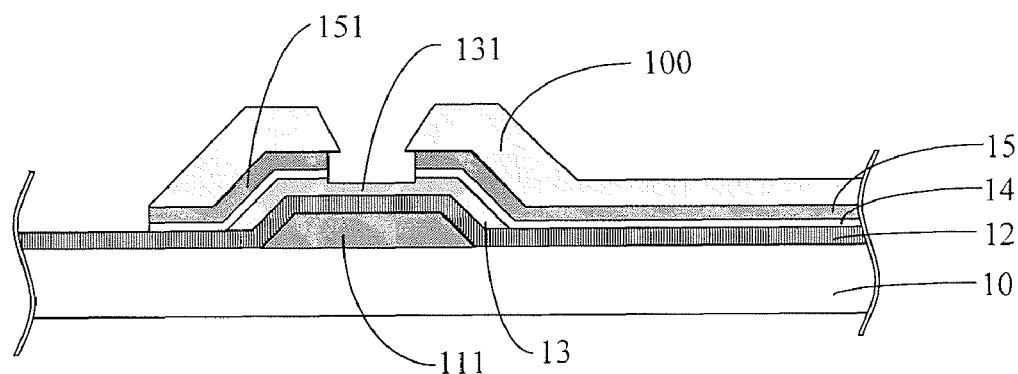
FIG. 2C is a cross section view showing the substrate after etching the substrate of FIG. 2B.
Figure 2D:
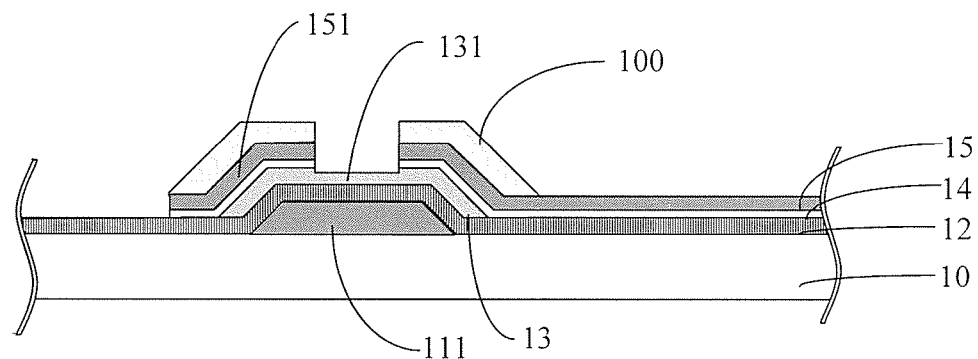
FIG. 2D is a cross section view showing the substrate after ashing the photoresist pattern layer on the substrate of FIG. 2C.
Figure 2E:
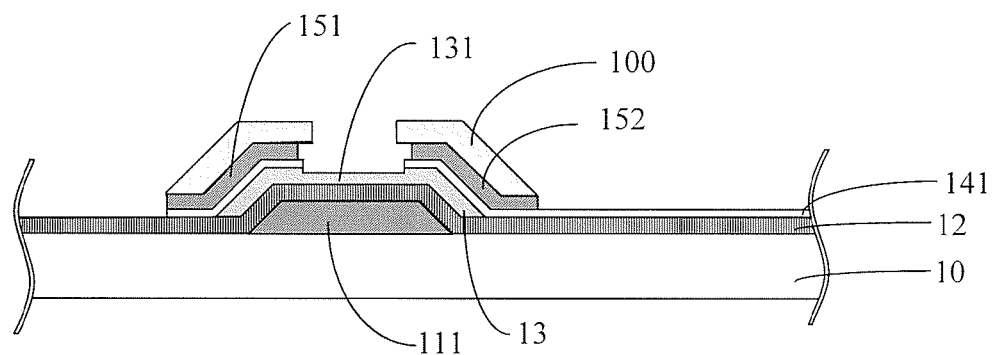
FIG. 2E is a cross section view showing the substrate after etching the substrate of FIG. 2D.
Figure 2F:
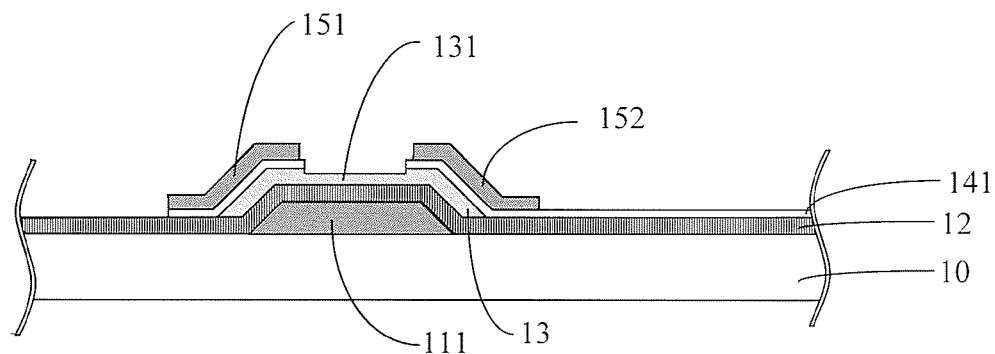
FIG. 2F is a cross section view showing the substrate after removing the photoresist pattern layer of FIG. 2E.

As shown in FIG. 1, the array substrate of liquid crystal display that can be manufactured with the method according to the embodiment comprises a pixel region 101, a non-display region and a TFT region 102. The non-display region comprises a wiring region and other regions located between the pixel regions 101. The TFT region 102 comprises a TFT channel region 1021, a source electrode region 1022 and a drain electrode region 1023. The wiring region comprises a gate line region 103 and a data line region 104. The pixel region 101 is the region formed by a plurality of pixel electrodes 141, the gate line region 103 is the region formed by a plurality of gate lines 11, and the data line region 104 is the region formed by a plurality of data lines 16.

Figure 4A:
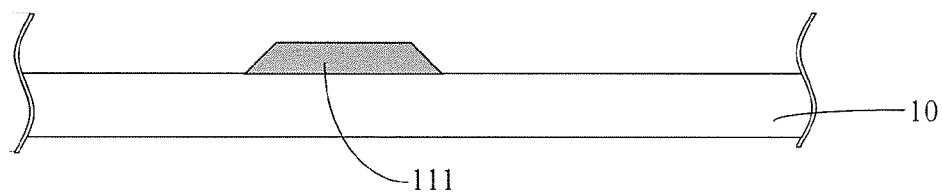
FIG. 4A is cross section view showing a substrate having gate lines with integrated gate electrode.
Figure 4B:
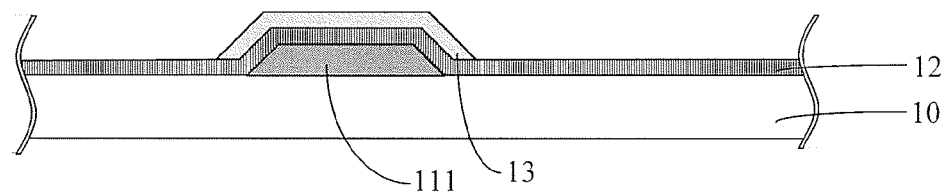
FIG. 4B is cross section view showing the substrate after forming a gate insulating layer and an active layer pattern on the substrate of FIG. 4A.
Figure 4C:
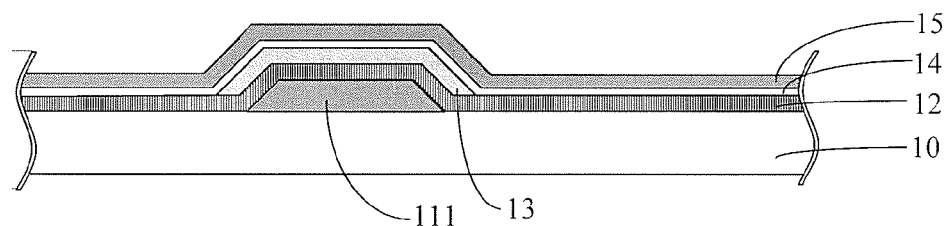
FIG. 4C is a cross section view showing the substrate after depositing a first transparent conductive layer and a source/drain metal layer on the substrate of FIG. 4B.
Figure 4D:
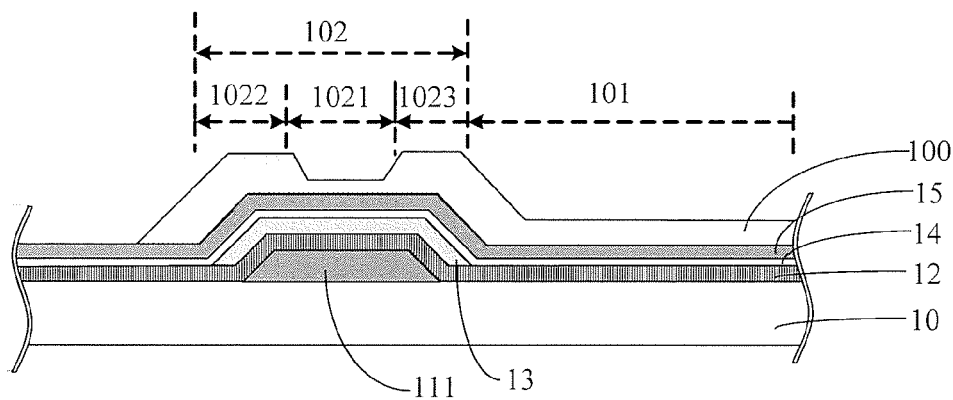
FIG. 4D is a cross section view showing the substrate after forming a photoresist pattern layer on the substrate of FIG. 4C.
Figure 4E:
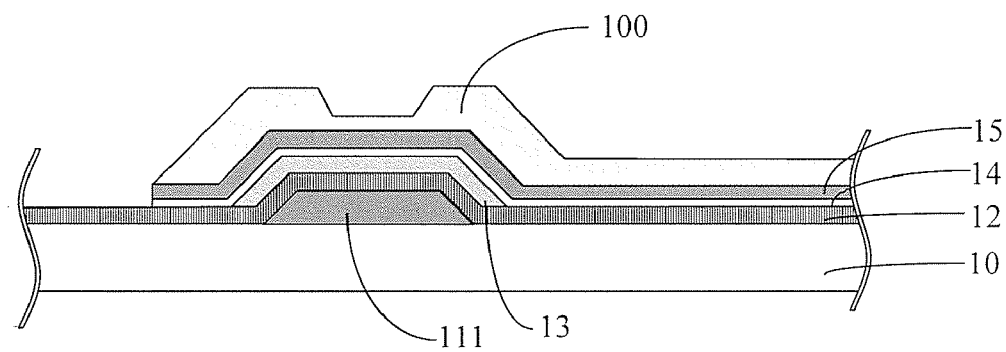
FIG. 4E is a cross section view showing the substrate after etching the substrate of FIG. 4D.
Figure 4F:
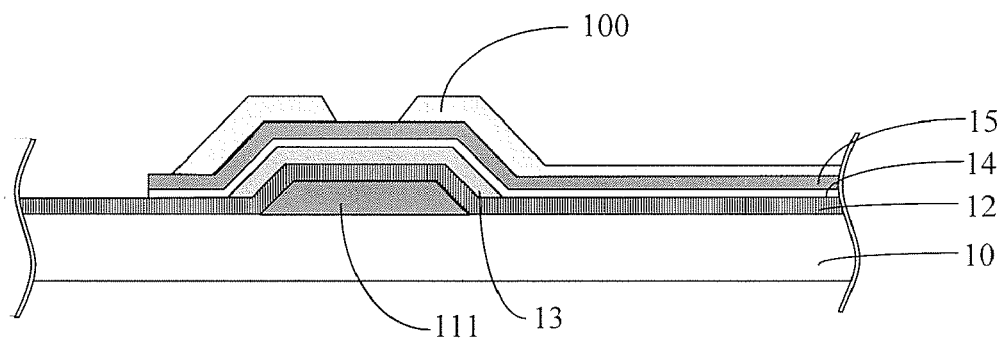
FIG. 4F is a cross section view showing the substrate after the photoresist pattern layer of FIG. 4E is ashed by a first ashing process.
Figure 4G:
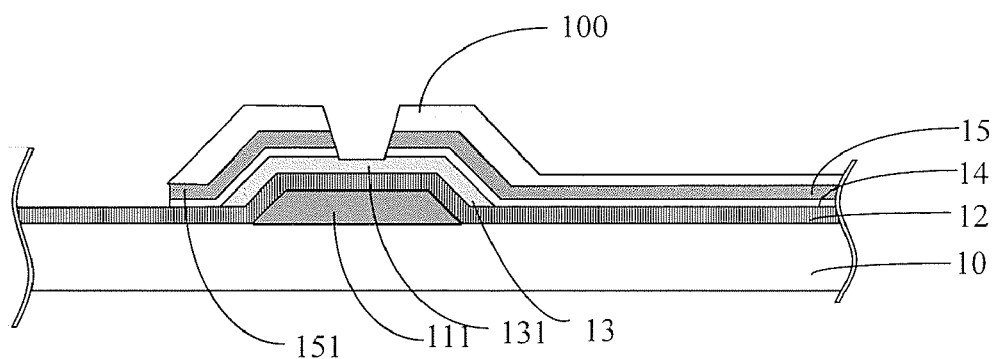
FIG. 4G is a cross section view showing the substrate after dry-etching the TFT channel region of FIG. 4F.
Figure 4H:
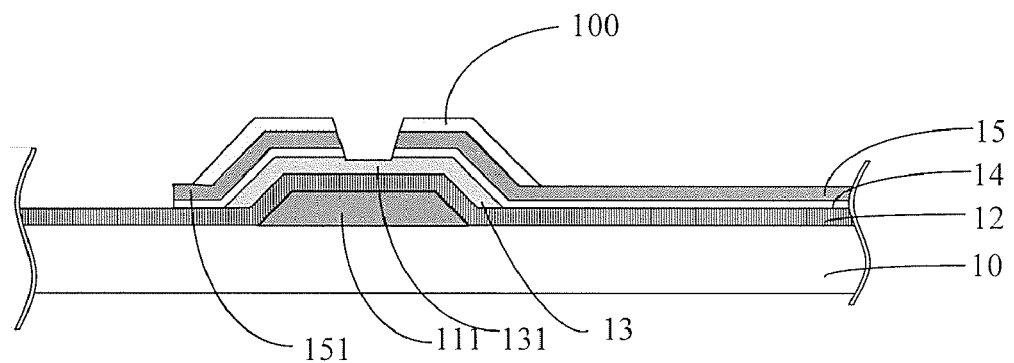
FIG. 4H is a cross section view showing the substrate after the photoresist pattern layer of FIG. 4G is ashed by the second ashing process.
Figure 4I:
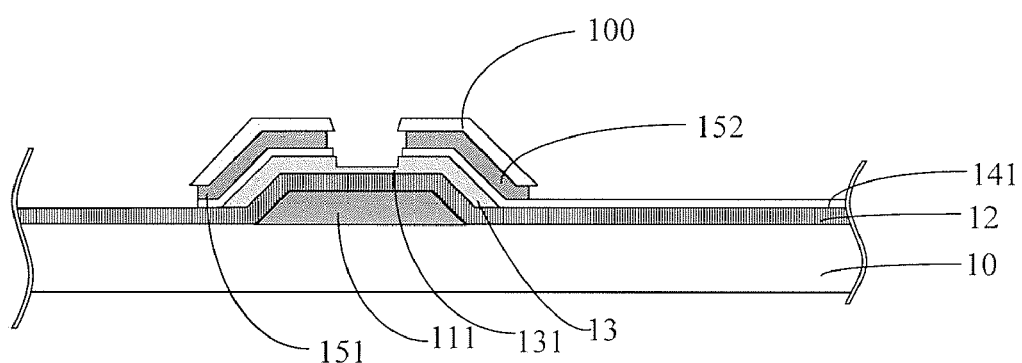
FIG. 4I is a cross section view showing the substrate after wet-etching the substrate of FIG. 4H.
Figure 4J:
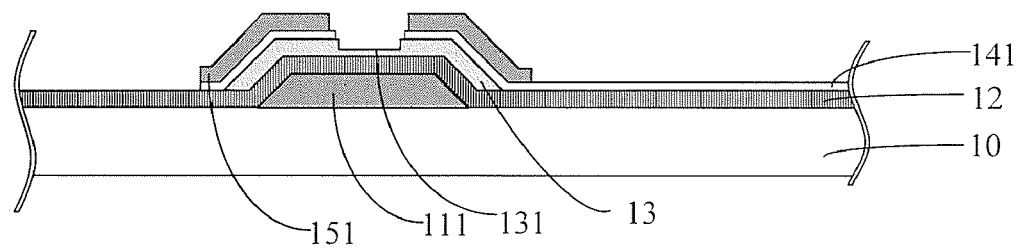
FIG. 4J is a cross section view showing the substrate after removing the photoresist pattern layer of FIG. 4I.

Now, referring to FIG. 1 and FIG. 4A to FIG. 4G, FIG. 4A is cross section view showing a substrate having a gate line with integrated gate electrode; FIG. 4B is cross section view showing the substrate after forming a gate insulating layer and an active layer pattern on the substrate of FIG. 4A; FIG. 4C is a cross section view showing the substrate after depositing a first transparent conductive layer and a source/drain metal layer on the substrate of FIG. 4B; FIG. 4D is a cross section view showing the substrate after forming a photoresist pattern layer on the substrate of FIG. 4C; FIG. 4E is a cross section view showing the substrate after etching the substrate of FIG. 4D; FIG. 4F is a cross section view showing the substrate after the photoresist pattern layer of FIG. 4E is ashed by a first ashing process; FIG. 4G is a cross section view showing the substrate after dry-etching the TFT channel region of FIG. 4F; FIG. 4H is a cross section view showing the substrate after the photoresist pattern layer of FIG. 4G is ashed by the second ashing process; FIG. 4I is a cross section view showing the substrate after wet-etching the substrate of FIG. 4H; and FIG. 4J is a cross section view showing the substrate after removing the photoresist pattern layer of FIG. 4I.

The method for manufacturing an array substrate of liquid crystal display according to the invention comprises the steps as follows.

In step aa, a substrate 10 with a first metal layer, a first insulating layer, a semiconductor layer and a doped semiconductor layer formed on the TFT region 102 is provided. The substrate 10 is covered by the first insulating layer, and the first metal layer is further formed in the gate line region 103. For example, the first metal layer is formed by a single layer of Cr, W, Ti, Ta, Mo, Al or Cu, or by a composite layer of any combination of Cr, W, Ti, Ta, Mo, Al and Cu. The first metal layer formed in the TFT region 102 is used as the gate electrode 111 while the first metal layer formed in the gate line region 103 is used as the gate line 11. The gate line 11 and the gate electrode 111 are covered by the first insulating layer serving as the gate insulating layer 12 so that the gate line 11 and the gate electrode 111 are insulated from other structures. Specifically, the first metal layer is firstly deposited on the substrate 10. With a photolithographic process, the first metal layer in the TFT region 102 is remained to form the gate electrode 111 while the first metal layer in the gate line region 103 is remained to form the gate line 11 (refer to FIG. 1), as shown in FIG. 4A. Then, the gate insulating layer 12 and the active layer (the semiconductor layer and the doped semiconductor layer) are deposited in this order. With a photolithographic process, only the active layer in the TFT region 102 is remained to form the active layer pattern 13, as shown in FIG. 4B.

In step bb, a first transparent conductive layer 14 and a second metal layer are deposited in this order on the substrate after step aa. The second metal layer is used as the metal layer 15 for source/drain electrodes, as shown in FIG. 4C. For example, the source/drain metal layer is formed by a single layer of Cr, W, Ti, Ta, Mo, Al or Cu, or by a composite layer of any combination of Cr, W, Ti, Ta, Mo, Al and Cu. In addition, for example, the first conductive layer is formed by ITO or IZO.

In step cc, a photoresist pattern layer 100 is formed on the second metal layer through a triple-tone mask, wherein the photoresist pattern layer 100 in the TFT channel region 1021 has a first thickness, the photoresist pattern layer 100 in the pixel region 101 has a second thickness, the photoresist pattern layer 100 in the source electrode region 1022, the drain electrode region 1023 and the data line region 104 (refer to FIG. 1) has a third thickness, and the first thickness is smaller than the second thickness while the second thickness is smaller than the third thickness, as shown in FIG. 4D.

In step dd, the second metal layer (the metal layer 15 for source/drain electrodes) and the first transparent conductive layer 14 in the non-display region other than the data line region 104 (refer to FIG. 1) are etched, as shown in FIG. 4E. Since the etching process is required to perform on a large area of the substrate, a wet-etching process is employed. At this time, since the photoresist pattern layer 100 is still remained in the TFT channel region 1021, the TFT channel region 1021 is not etched.

In step ee, a first ashing process is performed on the photoresist pattern layer 100 to expose the second metal layer (the metal layer 15 for source/drain electrodes) in the TFT channel region 1021, as shown in FIG. 4F. At this time, the thickness of the photoresist pattern layer 100 removed by the ashing process is the first thickness. Therefore, the photoresist pattern layer 100 in the TFT channel region 1021 is removed and the metal layer 15 for source/drain electrodes is exposed. In addition, the thickness of the photoresist pattern layer 100 in other regions is also reduced by the first thickness.

In step ff, the second metal layer (the metal layer 15 for source/drain electrodes), the first transparent conductive layer 14 and a portion of the active layer pattern 13 in the TFT channel region 1021 are etched. At this time, since the etching process is performed on the TFT channel region 1021 with a small area, a dry-etching process is employed to accurately control the extent to be etched. Thus, the metal layer 15 for source/drain electrodes, the first transparent conductive layer 14 and a portion of the active layer pattern 13 (the doped semiconductor layer) are etched to form the TFT channel 131 and the source electrode 151, as shown in FIG. 4G.

In step gg, a second ashing process is performed on the photoresist pattern layer 100 to expose the second metal layer (the metal layer 15 for source/drain electrodes) in the pixel region 101, as shown in FIG. 4H. At this time, the thickness of the photoresist pattern layer 100 removed by the second ashing process is equivalent to the thickness obtained by subtracting the first thickness from the second thickness. Therefore, the metal layer 15 for source/drain electrodes in the pixel region 101 is exposed.

In step hh, the second metal layer (the metal layer 15 for source/drain electrodes) in the pixel region 101 is etched. At this time, since the etching is process is required to perform on a large area of the substrate, a wet-etching process is carried out. Therefore, the metal layer 15 for source/drain electrodes in the pixel region 101 is etched to form the drain electrode 152 and the pixel electrode 141, as shown in FIG. 4I.

In step ii, the remaining photoresist pattern layer is removed, as shown in FIG. 4J.

In addition, a second insulating layer may be deposited on the substrate after step ii to form a passivation layer pattern by a photolithographic process, and a second transparent conductive layer may be subsequently deposited to form a common electrode by a photolithographic process. Furthermore, a second insulating layer may be deposited on the substrate after step ii so that a passivation layer pattern is formed by a photolithographic process without removing photoresist, depositing a second transparent conductive layer on the photoresist and the passivation layer pattern, and a common electrode is formed on the passivation layer pattern using a lift-off process by removing the second transparent conductive layer on the photoresist.

According to the invention, the photoresist pattern layer is remained on the TFT channel region during the first wet-etching process so that the TFT channel region is protected, and then the TFT channel is formed by the dry-etching process capable of accurately controlling the degree of etching. In this way, the TFT channel is subject to one dry-etching process and one wet-etching process according to the embodiments in the present invention while it is conventionally subject to two wet-etching processes. Since the number of wet-etching processes performed on the TFT channel is decreased, the over-etching can be reduced and thus the display quality degradation of the liquid crystal display due to excessive wide TFT channel can be avoided.

In addition, the method of the invention may also be applied to manufacture the TN type or FFS type liquid crystal display, so that the source electrode, the drain electrode, the TFT channel and the pixel electrode can be formed by one photolithographic process and the over-etching can be reduced.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method for manufacturing an array substrate of liquid crystal display, comprising:
   a. providing a substrate having a gate line, a gate insulating layer and an active layer pattern formed thereon in this order;
   b. depositing a first transparent conductive layer and a source/drain metal layer in this order on the substrate;
   c. forming a photoresist pattern layer on the source/drain metal layer through a triple-tone mask;
   d. performing a wet-etching process on the source/drain metal layer and the first transparent conductive layer exposed from the photoresist pattern layer;
   e. performing a first ashing process on the photoresist pattern layer and performing a dry-etching process on the source/drain metal layer, the first transparent conductive layer and the active layer pattern exposed by the first ashing process;
   f. performing a second ashing process on the photoresist pattern layer and performing a wet-etching process on the source/drain metal layer exposed by the second ashing process; and
   g. removing the remaining photoresist pattern layer.

2. The method for manufacturing the array substrate of liquid crystal display according to claim 1, wherein for the photoresist pattern layer formed through the triple-tone mask, the thickness of the region to be exposed by the first ashing process of the step e is thinner than that of the region to be exposed by the second ashing process of the step f, and the thickness of the region to be exposed by the second ashing process of the step f is thinner than the thickness of the region corresponding to the remaining region of the step g.

3. The method for manufacturing the array substrate of liquid crystal display according to claim 2, further comprising:
   h. depositing an insulating layer on the substrate after the step g and forming a passivation layer pattern and via holes by a photolithographic process.

4. The method for manufacturing the array substrate of liquid crystal display according to claim 3, further comprising:
   i. depositing a second transparent conductive layer on the substrate after the step h and forming a common electrode from the second transparent conductive layer by a photolithographic process.

5. The method for manufacturing the array substrate of liquid crystal display according to claim 2, further comprises comprising:
   j. depositing an insulating layer on the substrate after the step g, forming a passivation layer pattern and via holes by a photolithographic process using a photoresist without removing the photoresist, depositing a second transparent conductive layer on the photoresist and the passivation layer pattern, and forming a common electrode from the second transparent conductive layer on the passivation layer pattern using a lift-off process by removing the second transparent conductive layer on the photoresist.

6. A method for manufacturing an array substrate of liquid crystal display, comprising:
   aa. providing a substrate having a first metal layer, a first insulating layer, a semiconductor layer and a doped semiconductor layer formed on a thin film transistor (TFT) region, wherein the substrate is covered by the first insulating layer, the substrate comprises a pixel region, a non-display region and a TFT region, and the TFT region comprises a TFT channel region, a source electrode region and a drain electrode region;
   bb. depositing a first transparent conductive layer and a second metal layer in this order on the substrate after the step aa;
   cc. forming a photoresist pattern layer on the second metal layer through a triple-tone mask, wherein the photoresist pattern layer in the TFT channel region has a first thickness, the photoresist pattern layer in the pixel region has a second thickness, the photoresist pattern layer in the source electrode region and the drain electrode region has a third thickness, and the first thickness is smaller than the second thickness while the second thickness is smaller than the third thickness;
   dd. etching the second metal layer and the first transparent conductive layer in the non-display region;
   ee. performing a first ashing process on the photoresist pattern layer to expose the second metal layer in the TFT channel region;
   ff. etching the second metal layer, the first transparent conductive layer and the doped semiconductor layer in the TFT channel region;
   gg. performing a second ashing process on the photoresist pattern layer to expose the second metal layer in the pixel region;
   hh. etching the second metal layer in the pixel region; and
   ii. removing the remaining photoresist pattern layer.

7. The method for manufacturing the array substrate of liquid crystal display according to claim 6, wherein a wet-etching process is employed in the step dd and the step hh, and a dry-etching process is employed in the step ff.

8. The method for manufacturing the array substrate of liquid crystal display according to claim 7, wherein the method further comprises the following step:
   jj. depositing a second insulating layer on the substrate after the step ii and forming a passivation layer pattern and via holes by a photolithographic process.

9. The method for manufacturing the array substrate of liquid crystal display according to claim 8, wherein the method further comprises the following step:
   kk. depositing a second transparent conductive layer on the substrate after the step jj and forming a common electrode from the second transparent conductive layer by a photolithographic process.

10. The method for manufacturing the array substrate of liquid crystal display according to claim 7, wherein the method further comprises the following step:
    ll. depositing a second insulating layer on the substrate after the step ii, forming a passivation layer pattern and via holes by a photolithographic process using a photoresist without removing the photoresist, depositing a second transparent conductive layer on the photoresist and the passivation layer pattern, and forming a common electrode from the second transparent conductive layer on the passivation layer pattern using a lift-off process by removing the second transparent conductive layer on the photoresist.

* * * * *